United States Patent [19]
Lee

[11] Patent Number: 5,166,630
[45] Date of Patent: Nov. 24, 1992

[54] LOW CURRENT SWITCHED CAPACITOR CIRCUIT

[75] Inventor: King F. Lee, Hollywood, Fla.

[73] Assignee: Motorola, Inc., Schaumburg, Ill.

[21] Appl. No.: 840,671

[22] Filed: Feb. 20, 1992

Related U.S. Application Data

[63] Continuation of Ser. No. 545,232, Jun. 28, 1990, abandoned, which is a continuation-in-part of Ser. No. 356,050, May 24, 1989, abandoned.

[51] Int. Cl.[5] .......................... H03F 1/02; H03F 3/04; H03K 5/00
[52] U.S. Cl. ........................................ 328/167; 330/9; 330/296; 307/520; 307/491; 307/296.3
[58] Field of Search ...................... 307/491, 494, 296.3; 330/296, 261, 9, 285; 328/167

[56] References Cited

U.S. PATENT DOCUMENTS

| | | | |
|---|---|---|---|
| 4,502,019 | 2/1985 | Van Roermund | 330/296 |
| 4,516,082 | 5/1985 | Smith et al. | 330/296 |
| 4,521,743 | 6/1985 | Heimer | 330/9 |
| 4,659,996 | 3/1987 | Nadir | 328/167 |
| 4,959,621 | 9/1990 | Hosticka et al. | 330/261 |

*Primary Examiner*—Timothy P. Callahan
*Attorney, Agent, or Firm*—Juliana Agon

[57] ABSTRACT

A switched capacitor circuit (10) is disclosed having reduced energy consumption. A variable bias (30) supplies an operating current (32) to the switched capacitor circuit (10). When the circuit (10) is not being utilized, the variable bias 30) supplies a lower, but non-zero current.

10 Claims, 2 Drawing Sheets

LOW CURRENT SWITCHED CAPACITOR CIRCUIT

This is a continuation of application Ser. No. 07/545,232, filed Jun. 28, 1990 and now abandoned which is a continuation-in-part of application Ser. No. 07/356,050 filed May 24, 1989, now abandoned.

TECHNICAL FIELD

This invention relates generally to energy (battery) saving circuits, and more particularly to the battery saving of a switched capacitor circuit that may be used as an integratable switched capacitor filter.

BACKGROUND ART

Switched capacitor circuits are known. Such circuits are the product of circuit design techniques commonly used to miniaturize (integrate) components. In portable (hand-held) communication applications, components such as filters are often reduced to integrated circuit (IC) form. A switched capacitor circuit utilizes the fact that when a capacitor is switched between a signal to be sampled and ground at a rate many times that of the frequency of the sampled signal, the capacitor will simulate the circuit behavior of a resistor.

To save the current drain (energy consumption) of a switched capacitor circuit, it is known to activate the switched capacitor circuit only when it is needed and to fully deactivate it when it is not in use. This provides maximized energy savings since the circuit only draws current when activated. However, substantial DC transient currents are produced when the switched capacitor circuit is turned ON and OFF (i.e., activated and deactivated). These DC transients increase the settling time required before information can be passed through the circuits, and therefore, cannot be used in a system that requires fast turn-on time.

Another problem exists for the conventional battery saving technique of turning the switched capacitor circuit ON and OFF. For those communication applications that require continuous operation, such as squelch, discontinuities in the applied power would interrupt such operations, and therefore, would not be usable. Hence, a need exists to lower the current drain of switched capacitor circuits without introducing transient switching currents.

SUMMARY OF THE INVENTION

Accordingly, it is an object of the present invention to provide an energy efficient switched capacitor circuit that avoids the transients generated in the prior art circuits.

Briefly, according to the invention, a switched capacitor circuit is provided having reduced energy consumption. A variable bias controls the operating current of the switched capacitor circuit. When the circuit is in standby mode, the variable bias provides a lower, but non-zero, current.

Another aspect of the invention provides that the switched capacitor circuit also includes switching means for switching the switched capacitor circuit when the switched capacitor circuit is in an operational mode. On the other hand, when the switched capacitor circuit is in a standby mode, disabling means are provided for disabling the switching of the switched capacitor circuit to further reduce the current consumption.

DETAILED DESCRIPTION OF THE PREFERRED EMBODIMENT

Figure 1:
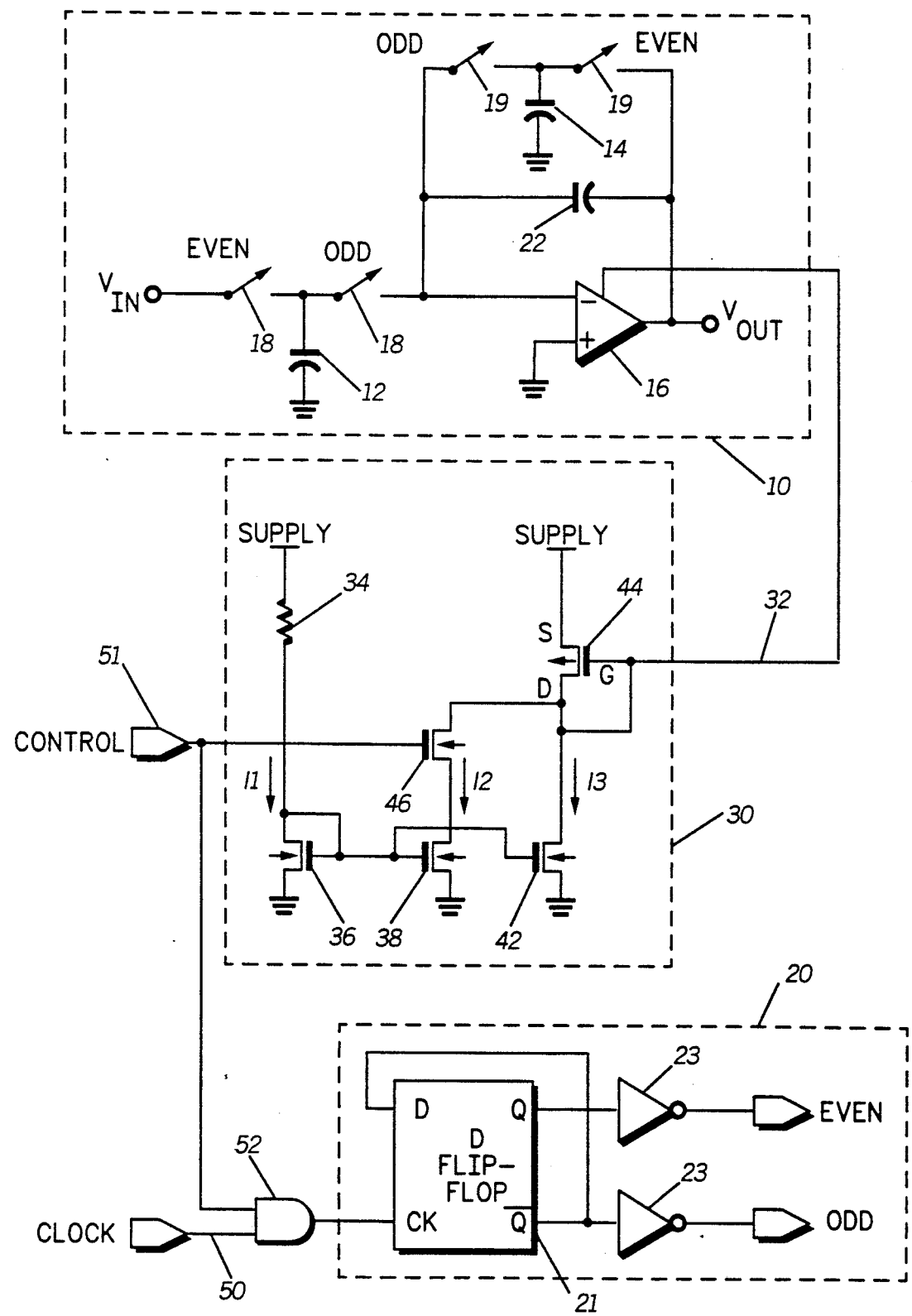
FIG. 1 is a schematic diagram of a switched capacitor circuit according to the present invention.

Referring to FIG. 1, a switched capacitor circuit using a low-pass filter as an example is shown according to the present invention. A conventional switched capacitor filter 10 comprises an operational amplifier 16 and a pair of switched capacitors 12 and 14 (that simulate resistors when switched rapidly), and a non-switched capacitor 22 forming a simple low-pass filter configuration in an integratable form.

An input signal, $V_{in}$, is coupled to an inverting input of the operational amplifier (Op Amp) 16 by a pair of sampling switches 18. As is readily understood in the art, there are commonly two phases of sampling signals associated with the switches 18. These are an EVEN phase and an ODD phase. Typically, these signals are of complimentary phase and are generated from a clock signal 50 by a clock phase generation circuit 20. All the switches marked "EVEN" are closed simultaneously, then opened followed by a closure of all the switches marked "ODD". When the switch 18 is closed for the EVEN phase, the current provided by $V_{IN}$ charges the capacitor 12. The charge accumulated on the capacitor 12 during the EVEN sampling phase is re-distributed to the capacitors 14 and 22 when the switches 18 and 19 are closed for the ODD phase.

As in a conventional active RC low-pass filter, the positive input of the Op Amp 16 is grounded. The Op Amp 16 provides an output signal, $V_{out}$, a portion of which is fed back to the negative input of the Op Amp 16 by a capacitor 22 and the capacitor 14 (in conjunction with the sampling switch 19 during the EVEN phase).

Since the current drain of a switched capacitor circuit is approximately equal to the number of operational amplifiers times the current drain per Op Amp, savings in current drain can be achieved by reducing the current drain of each Op Amp. However, there is a limit on how low the Op Amp current drain can be set and still maintain the performance of the switched capacitor circuit in normal operation. According to the invention, a variable bias control network 30 provides the control to the Op Amp 16 to bias the Op Amp 16 at the optimal limit in normal operation mode and to bias the Op Amp at a reduced current drain in a standby mode.

A resistor 34 and an N-channel MOSFET 36 set up a current reference I1 that is mirrored by a pair of N-channel MOSFETs 38 and 42 as currents I2 and I3 respectively. A P-channel MOSFET 44, with its gate terminal (G) connected to the drain terminal (D), provides the current source capability for the sum of the mirrored currents I2 and I3.

To insure that the operational amplifier 16 is never completely turned OFF, and yet to be able to reduce the current drain on demand, a control signal 51 is coupled to the gate of an N-channel MOSFET 46 to selectively turn the current I2 ON and OFF. The drain current of the MOSFET 44 (which comprises I2+I3 or only I3 depending on the mode) flowing through the MOSFET 44 will develop the bias voltage output 32.

During normal circuit operation (normal mode), the control signal 51 will be HIGH, which turns on the MOSFET 46. In this way, the sum of currents I2 and I3 flowing through the MOSFET 44 will develop a larger bias output voltage 32 (than from I3 alone) to bias the Op Amp 16 at a higher current (I4 and I6 of FIG. 2) having full drive capability.

Figure 2:
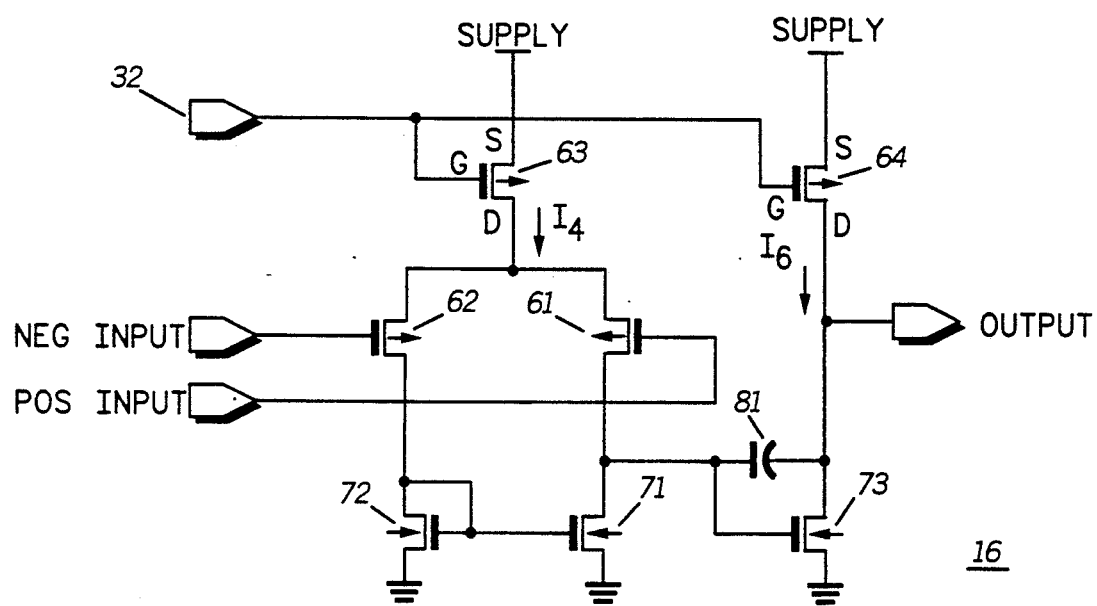
FIG. 2 is a schematic diagram of an operational amplifier of the switched capacitor circuit of FIG. 1 according to the present invention.

Referring to FIG. 2, a schematic diagram of the Op Amp 16 is illustrated in accordance with the present invention. The bias output 32 from the bias network 30 provides a bias voltage which determines the drive capability and current drain of the Op Amp 16. By voltage biasing the gates of P-channel MOSFETs 63 and 64, current sources I4 and I6 respectively are set up. The current I4 into and steered by a differential input pair of P-channel MOSFETs 61 and 62 drive active loads formed by N-channel MOSFETS 71 and 72. The negative input of the Op Amp 16 is at the gate electrode of the P-channel MOSFET 62, while the positive input of the Op Amp 16 is at the gate electrode of the P-channel MOSFET 61. An N-channel MOSFET 73 serves as a differential to single ended output amplifier stage to the differential input stage formed by the MOSFETS 61, 62, 71, and 72. The MOSFET 64 provides the current source I6 and also acts as an active load for the MOSFET 73. A feedback capacitor 81 provides frequency compensation for the Op Amp 16. Thus, as the bias voltage output 32 of the bias network 30 increases from having both the currents I2 and I3 flowing, more current is drained by the higher mirrored currents I4 and I6. These higher currents I4 and I6 are provided by MOSFETS 63 and 64, respectively, to drive a heavier load (OUTPUT) during the normal mode.

Referring back to FIG. 1, when the control signal 51 is LOW, the MOSFET 46 becomes non-conductive and no current (I2 is off or substantially zero) will flow through it. In this way, only the current I3 flowing through the MOSFET 44 will develop a smaller bias output voltage 32 to bias the Op Amp 16 to mirror a current (I4 and I6 of FIG. 2) having lower drive capability but achieving significant current savings. Thus, as the bias voltage output 32 of the bias network 30 decreases from having only I3 flowing, less current is drained by the lower mirrored currents I4 and I6. These lowered currents I4 and I6 are provided by MOSFETS 63 and 64, respectively, to drive a negligible load (OUTPUT) during the standby mode. Although limited, this mirrored current is sufficient to compensate for any leakage in the Op Amp 16 and to eliminate the DC transients from occurring when reactivated. The duty cycle (or duration) the control signal 51 will remain LOW is selectable to obtain the current reduction desired. The longer the control signal 51 is LOW, the less current is consumed.

From the foregoing detailed description, it can thus be seen that the present invention provides a switched capacitor circuit which includes an operational amplifier that is supplied with a high bias constant voltage to cause a high operating current to flow only during the normal mode and thereafter is voltage biased at a relatively low constant voltage level to cause a smaller operating current to flow so as to reduce current consumption during the standby mode. By analogy, using conventional biasing circuits, the present invention can be modified to provide an operational amplifier that is supplied with a high bias constant current only during the normal mode and thereafter is current biased at a relatively low constant current level so as to reduce current consumption during the standby mode. Thus, changing the bias conditions of the operational amplifier by providing a particular bias control state (high or low bias voltage, or high or low bias current) between the modes of operation will subsequently change the current drained from the operational amplifier to affect current consumption.

A further reduction in current consumption can be accomplished. During the standby mode, the limited drive capability of the Op Amp 16 is insufficient to drive the capacitors 12, 14 and 22. Therefore, the switching signals (ODD and EVEN) are also disabled. To disable the switching signals, the LOW control signal 51 is ANDed (52) with the CLOCK signal 50 to prevent the clock signal from driving the clock phase generation circuit 20. Stopping the switching function itself reduces current consumption by the Flip-Flop 21 and drivers 23 and further adds to the current saved by the reduced current drained by the Op Amp 16 during the standby mode. Since power and energy is a function of current, the amount of current consumed is related to the amount of energy and power consumed.

What is claimed is:

1. A switched capacitor circuit, comprising:
   an operational amplifier having a normal operating mode, a standby mode, and an inverting input terminal;
   a switched capacitor network having a capacitor and switch means for switching the coupling of said capacitor, said switch means coupled to said operational amplifier;
   means for placing the operational amplifier in said normal operating mode or said standby mode, in response to a status of a control signal; and
   disabling means for disabling said switched capacitor network from switching when said operational amplifier is in said standby mode, in response to the status of said control signal.

2. The switched capacitor circuit of claim 1, wherein said switched capacitor network comprises:
   generating means for generating complementary-phase first and second sampling signals;
   capacitor switching means for coupling said capacitor to said operational amplifier, said capacitor switching means having
   first and second switch means for switching said capacitor, said first and second switch means serially connecting to said inverting input terminal of said operational amplifier;
   said first switch means for coupling an input voltage to said capacitor, in response to said first sampling signal,
   said capacitor coupled to ground and to said first switch means, and
   said second switch means for coupling said capacitor to said inverting input terminal of said operational amplifier, in response to said second sampling signal.

3. A method for reducing energy consumption in a switched capacitor circuit including an operational amplifier, comprising the steps of:
   switching between the connection and disconnection of a capacitor of a switched capacitor network to said operational amplifier;
   providing a control signal to apportion said operational amplifier into a normal operating mode and a standby mode; and disabling said switched capacitor network from switching when said operational amplifier is in said standby mode, in response to said control signal.

4. The method for reducing energy consumption of claim 3 further comprising the step of:
applying a constant low bias voltage to said operational amplifier during the standby mode.

5. A switched capacitor circuit, comprising:
an operational amplifier having a normal operating mode, a standby mode, an inverting input terminal, a non-inverting input terminal, a bias input terminal, and an output terminal;
generating means for generating complementary-phase first and second sampling signals;
capacitor switching means for switching the coupling of a capacitor to said operational amplifier, said capacitor switching means having
first and second switch means for switching said capacitor, said first and second switch means serially connecting to said inverting input terminal of said operational amplifier;
said first switch means for coupling an input voltage to said capacitor, in response to said first sampling signal,
said capacitor coupled to ground and to said first switch means, and
said second switch means for coupling said capacitor to said inverting input terminal of said operational amplifier, in response to said second sampling signal;
means for placing the operational amplifier in said normal operating mode or said standby mode, in response to a status of a control signal;
variable bias means, responsive to said control signal, for providing a constant high bias signal during only the entire normal operating mode to said bias input terminal of said operational amplifier; and
disabling means coupled to said generating means for disabling the generation of said first and second sampling signals when said operational amplifier is in said standby mode, in reponse to the status of said control signal.

6. The switched capacitor circuit of claim 5 wherein said capacitor switching means is integratable.

7. The switched capacitor circuit of claim 5 wherein said variable bias means comprises variable bias voltage means.

8. The switched capacitor circuit of claim 7 wherein said variable bias voltage means comprises:
a first transistor for conducting a first current to develop a nominal bias output voltage;
a second transistor for conducting a second current;
summing means for summing said second current with said first current to develop an increased bias output voltage from said first and second currents; and
control means coupled to said second transistor for selectively disabling said second current to reduce said increased bias output voltage to said nominal bias output voltage from said first current alone.

9. The switched capacitor circuit of claim 5 wherein said generating means comprises clock phase generation means for generating complementary-phase first and second sampling signals.

10. The switched capacitor circuit of claim 9 wherein said disabling means is coupled to said clock phase generation means for stopping said phase generation means from switching said first and second switch means when said operational amplifier is in said standby mode.

* * * * *